United States Patent
Wang et al.

(10) Patent No.: US 12,200,991 B2
(45) Date of Patent: Jan. 14, 2025

(54) DISPLAY MODULE AND DISPLAY APPARATUS

(71) Applicant: Huawei Technologies Co., Ltd., Shenzhen (CN)

(72) Inventors: Lei Wang, Dongguan (CN); Liangyu Pan, Dongguan (CN); Yuan Yan, Shenzhen (CN); Haiyan Li, Shenzhen (CN); Yongqiang Pang, Shenzhen (CN); Yang Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 39 days.

(21) Appl. No.: 17/769,223

(22) PCT Filed: Aug. 21, 2020

(86) PCT No.: PCT/CN2020/110597
§ 371 (c)(1),
(2) Date: Apr. 14, 2022

(87) PCT Pub. No.: WO2021/073250
PCT Pub. Date: Apr. 22, 2021

(65) Prior Publication Data
US 2024/0122001 A1     Apr. 11, 2024

(30) Foreign Application Priority Data
Oct. 15, 2019   (CN) .......................... 201910979391.9

(51) Int. Cl.
*H10K 59/131* (2023.01)
*G09F 9/30* (2006.01)
*G09G 3/3225* (2016.01)
*H10K 59/88* (2023.01)
*H10K 77/10* (2023.01)

(52) U.S. Cl.
CPC ........... *H10K 59/131* (2023.02); *H10K 59/88* (2023.02); *H10K 77/111* (2023.02)

(58) Field of Classification Search
CPC ................. H10K 59/88; H10K 59/131; G09G 2300/0413; G09G 2300/0426
See application file for complete search history.

(56) References Cited

U.S. PATENT DOCUMENTS

| | | | |
|---|---|---|---|
| 10,001,640 | B1 | 6/2018 | Kumar et al. |
| 2016/0035284 | A1 | 2/2016 | Jung et al. |
| 2017/0288006 | A1 | 10/2017 | Yang et al. |
| 2018/0011514 | A1* | 1/2018 | Yoo ........................ G06F 1/1658 |

(Continued)

FOREIGN PATENT DOCUMENTS

| | | |
|---|---|---|
| CN | 102446926 A | 5/2012 |
| CN | 105321474 A | 2/2016 |

(Continued)

*Primary Examiner* — Mohsen Ahmadi
(74) *Attorney, Agent, or Firm* — Conley Rose, P.C.

(57) ABSTRACT

A display includes a polygonal display region and a plurality of non-display portions. The non-display portions are coupled to side edges of the display region in a one-to-one correspondence. At least two of the non-display portions are bent to a back side of the display region. When the non-display portions bent to the back side include adjacent non-display portions, there is an opening between two adjacent non-display portions.

16 Claims, 12 Drawing Sheets

(56) References Cited

U.S. PATENT DOCUMENTS

| | | | |
|---|---|---|---|
| 2018/0074361 A1 | 3/2018 | Chung et al. | |
| 2018/0076415 A1 | 3/2018 | Chung et al. | |
| 2019/0004645 A1 | 1/2019 | Wang et al. | |
| 2019/0056762 A1 | 2/2019 | Azam et al. | |
| 2019/0146548 A1* | 5/2019 | Li | G06F 1/1637 361/679.01 |
| 2021/0209971 A1 | 7/2021 | Chu et al. | |
| 2022/0069055 A1* | 3/2022 | Bok | H10K 59/40 |

FOREIGN PATENT DOCUMENTS

| | | |
|---|---|---|
| CN | 105448204 A | 3/2016 |
| CN | 105531753 A | 4/2016 |
| CN | 107479766 A | 12/2017 |
| CN | 107742480 A | 2/2018 |
| CN | 107819009 A | 3/2018 |
| CN | 107835277 A | 3/2018 |
| CN | 108399858 A | 8/2018 |
| CN | 207765448 U | 8/2018 |
| CN | 207781091 U | 8/2018 |
| CN | 108538202 A | 9/2018 |
| CN | 109188801 A | 1/2019 |
| CN | 109192078 A | 1/2019 |
| CN | 209000421 U | 6/2019 |
| CN | 110275633 A | 9/2019 |
| JP | 2019160174 A | 9/2019 |

\* cited by examiner

DISPLAY MODULE AND DISPLAY APPARATUS

CROSS-REFERENCE TO RELATED APPLICATIONS

This is a U.S. National Stage of International Patent Application No. PCT/CN2020/110597 filed on Aug. 21, 2020, which claims priority to Chinese Patent Application No. 201910979391.9 filed on Oct. 15, 2019. Both of the aforementioned applications are hereby incorporated by reference in their entireties.

TECHNICAL FIELD

This application relates to the field of display apparatus technologies, and in particular, to a display module and a display apparatus.

BACKGROUND

Compared with a conventional display, a flexible display has many unique features such as lightness, shock resistance, and flexibility, and therefore a display apparatus can be lighter, portable, beautiful, and fashionable. The features provide wider development space for the flexible display. Therefore, in the field of display technologies, a flexible display technology has attracted wide attention and has been widely studied.

FIG. 1 is a schematic diagram of a structure of a flexible display module in the conventional technology. The flexible display module usually includes a display region and a non-display region. The non-display region is usually located around a screen, and is used to accommodate a drive circuit, a reliability protection device, and a packaging reliability structure. To increase a screen-to-body ratio and obtain better visual experience, an area of the non-display region needs to be further reduced, resulting in a reduction in design space of a device and the reliability structure in the non-display region. A reduction in space of the non-display region may lead to risks such as insufficient driving force from the drive circuit, poor structural reliability, and a relatively low yield. Therefore, a frame of a display apparatus still has a specific width.

As shown in FIG. 1 and FIG. 2, FIG. 2 is a schematic diagram of a side structure of the flexible display module. A signal cable is disposed in the non-display region of the flexible display module. Drive devices such as a chip and a flexible printed circuit are disposed in a non-display region 021 on a first side of the flexible display module. The non-display region 021 on the first side is provided with an outer lead bonding (Outer Lead Bonding, OLB for short) region, and an external drive signal device needs to be connected, and consequently relatively large space is occupied. Therefore, the non-display region 021 on the first side and a peripheral device usually need to be bent to a back side of the display region (COP Bending), to implement an effective solution in which there is an ultra-narrow frame on the first side of the flexible display module.

SUMMARY

This application provides a display module and a display apparatus, to increase a screen-to-body ratio of the display module, facilitate implementation of a frameless structure of the display module, and improve reliability of the display module.

According to a first aspect, this application provides a display module. The display module includes a display region and a non-display region. The non-display region is located around the display region. The display region is a polygonal display region, and includes a plurality of side edges. The non-display region includes non-display portions connected to the side edges in a one-to-one correspondence. At least two of the plurality of non-display portions are bent to a back side of the display region. A relatively large quantity of non-display portions are bent to the back side of the display region, and therefore a screen-to-body ratio of the display module can be increased. In addition, in this solution, a relatively large width may be designed for the non-display portion, and therefore it can be implemented that design space of the non-display portions is not limited, and a width of a signal line, a size of a reliability device, and a water oxygen protection path can be designed with reliability, thereby improving reliability of a display. When the non-display portions bent to the back side of the display region include adjacent non-display portions, there may be an opening between two adjacent non-display portions. The opening extends from an edge that is of the non-display region and that is far away from the display region to the display region. In this solution, it is convenient to reduce pulling force between the adjacent non-display portions, and stress concentration may be reduced after the adjacent non-display portions are bent to the back side of the display region. Therefore, it can be implemented that there is relatively high connection reliability while the screen-to-body ratio of the display module is increased or a frameless structure of the display module is implemented. In this embodiment of this application, the non-display portion is provided with a signal line, and signal lines of the adjacent non-display portions are electrically connected by using a connecting line. The connecting line is used to connect the signal lines of the adjacent non-display portions. In this solution, the non-display portions are in a one-to-one correspondence with the side edges of the display region, and there is an opening between the adjacent non-display portions, and therefore the opening is opposite to a corner region of the display region. In this case, the connecting line used to connect the signal lines of the adjacent non-display portions may be disposed in the corner region of the display region, to control the display module to display a picture.

During specific disposing of the display module, the display region may include an active display region and a dummy pixel region. The dummy pixel region is located between the active display region and the non-display region, and the dummy pixel region is used as a buffer between the active display region and the non-display region, and is displayed in a dark state, to avoid abnormal display during transition from the display region to the non-display region.

During specific disposing of the connecting line, the connecting line may be located on a back side of the dummy pixel region. In this way, there is no need to make the connecting line on a back side of the active display region, to help improve a display effect of the active display region.

During bending of the non-display portions, the non-display portions may be bent along the dummy pixel, so that there can be a relatively good display effect in the active display region, and a disadvantage such as deformation is not likely to occur in an edge region.

During specific disposing of the signal line and the connecting line, a manner of connecting the signal line and the connecting line is not limited. The signal line and the connecting line may be disposed at a same layer, and the signal line and the connecting line are directly connected. Alternatively, the signal line and the connecting line may be disposed at different layers, a via hole is disposed in the display region or the non-display portion, and the signal line and the connecting line are connected through the via hole.

During specific disposing of the display module, all of the non-display portions may be bent to the back side of the display region, to implement the frameless structure of the display module, and facilitate implementation of splicing display of the display module. In addition, there is an opening between the adjacent non-display portions, and therefore stress concentration is not likely to occur in a corner region of the display module, and the display module has relatively high reliability.

During specific disposing of the opening, a shape of the opening is not specifically limited. The opening may be a gap or a groove. When the opening is a gap, a specific extension direction of the gap is not limited, provided that the adjacent non-display portions are disconnected in the corner region. When the opening is a groove, a specific shape of the groove is not limited. The groove may be a U-shaped groove, a V-shaped groove, or a rectangular groove, or may be a groove in another shape. A user may make a selection based on a requirement such as line layout or a simplified manufacturing process.

During specific disposing of a structure of the opening, the display region and a layer of non-display portions may be stacked, in other words, there is no overlapping region between the bent non-display portions. In this solution, stress between the adjacent non-display portions can be further reduced, to improve reliability of the display module.

According to a second aspect, this application further provides a display apparatus. The display apparatus includes the display module in any one of the foregoing technical solutions. The display apparatus features a relatively large screen-to-body ratio and relatively high reliability, and facilitates implementation of a frameless structure.

Specifically, the display apparatus may include at least two display modules. At least two non-display portions of the display module are bent to a back side of a display region, to facilitate splicing of the display modules. Therefore, the display modules of the display apparatus are spliced for display, to help increase a display area based on a requirement.

REFERENCE NUMERALS

Figure 1:
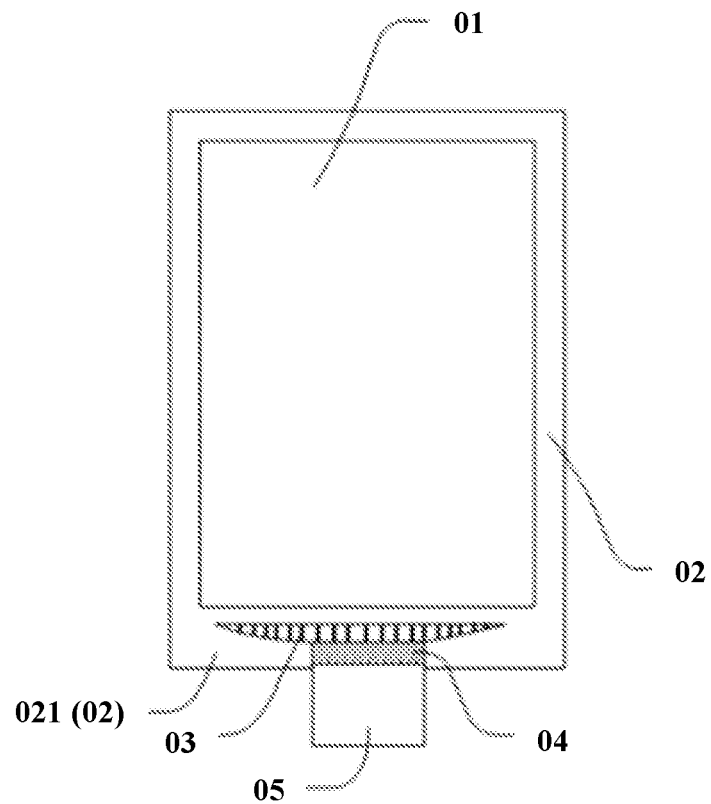
FIG. 1 is a schematic diagram of a structure of a flexible display module in the conventional technology.
Figure 2:
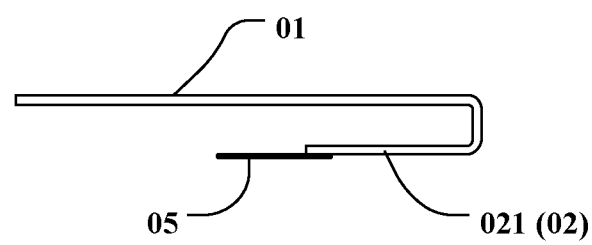
FIG. 2 is a schematic diagram of a side structure of a flexible display module in the conventional technology.

Part in the Conventional Technology:
01: Display region; 02: Non-display region;
021: Non-display region on a first side; 03: Signal cable;
04: Chip; and 05: Flexible printed circuit.
Part in this Application:
1: Display region; 11: Connecting line;
12: Active display region; 13: Dummy pixel region;
2: Non-display region; 21: Non-display portion;
211: First non-display portion; 212: Second non-display portion;
22: Signal line; 3: Gate driver on array circuit;
4: Signal cable; 5: Drive chip;
6: Flexible printed circuit; 7: Opening; and
8: Via hole.

DESCRIPTION OF EMBODIMENTS

Terms used in the following embodiments are merely intended to describe particular embodiments, but are not intended to limit this application. Terms "one", "a", "the", "the foregoing", "this", and "the one" of singular forms used in this specification and the appended claims of this application are also intended to include plural forms such as "one or more", unless otherwise specified in the context clearly.

Reference to "an embodiment", "some embodiments", or the like described in this specification indicates that one or more embodiments of this application include a specific feature, structure, or characteristic described with reference to the embodiments. Therefore, in this specification, statements, such as "in an embodiment", "in some embodiments", "in some other embodiments", and "in other embodiments", that appear at different places do not necessarily mean referring to a same embodiment, instead, they mean "one or more but not all of the embodiments", unless otherwise specifically emphasized. The terms "include", "contain", "have", and their variants all mean "include but are not limited to", unless otherwise specifically emphasized.

A display module provided in the embodiments of this application may be applied to a display apparatus. The display apparatus may be a common mobile terminal such as a mobile phone, a tablet computer, or an electronic book, or may be another electronic display setting such as a notebook computer, a television, or a device display. The display module of the display apparatus is flexible, is a flexible display module, and may be specifically an active matrix organic light emitting display (Active Matrix Organic Light Emitting Display, AMOLED for short).

The display module includes a display region and a non-display region. A drive circuit, a drive chip, a protective structure, and a package structure usually need to be disposed in the non-display region. Therefore, to ensure normal working of the display module, it is difficult to continue to reduce a size of the non-display region after the size is reduced to a specific extent. However, currently, there is an increasingly high requirement on a screen-to-body ratio of the display apparatus, and therefore a ratio of the non-display region to a display needs to be further reduced. In the conventional technology, a side, of the non-display region, on which a structure such as the drive chip or a flexible printed circuit is disposed may be bent to a back side of the display region, to reduce a ratio of the non-display region on the side. For example, the display module is a rectangular display module. After one side is bent, the other three sides still occupy a specific screen area. To increase a screen-to-body ratio of the display module, this application provides a display module and a display apparatus. To make the objectives, technical solutions, and advantages of this application clearer, the following further describes this application in detail with reference to the accompanying drawings.

Figure 3:
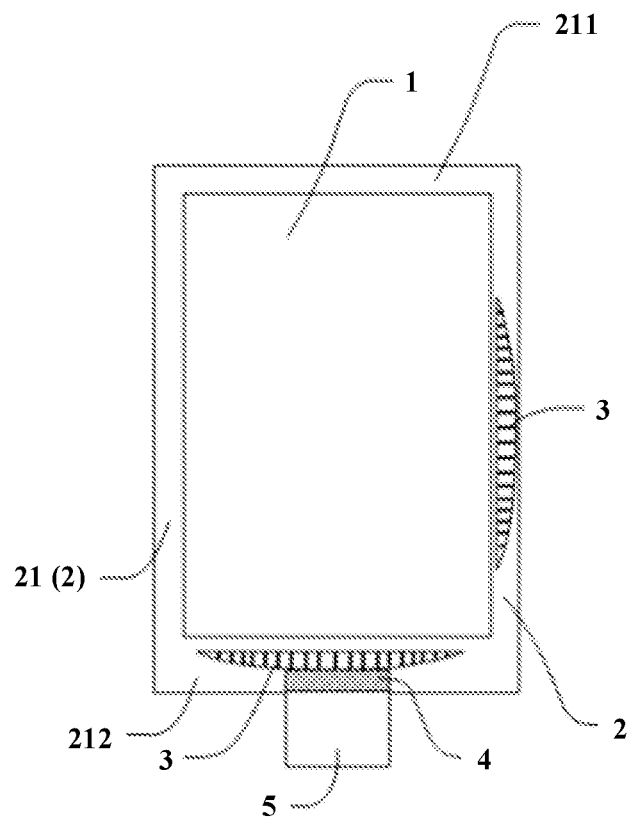
FIG. 3 is a schematic diagram of an expanded structure of a display module according to an embodiment of this application.
Figure 4:
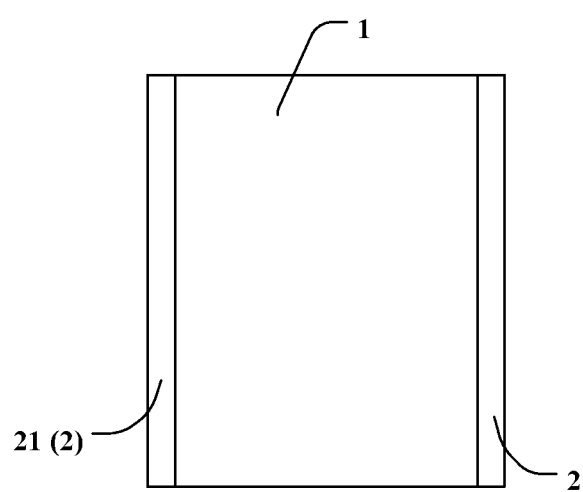
FIG. 4 is a schematic diagram of a top-view structure of a display module according to an embodiment of this application.
Figure 5:
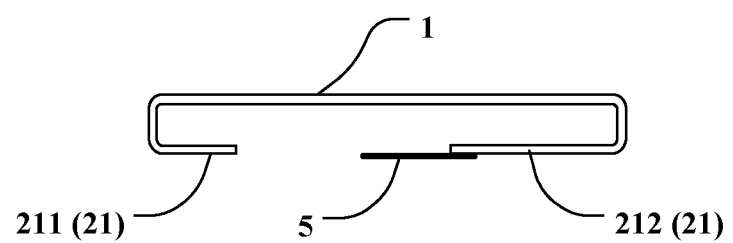
FIG. 5 is a schematic diagram of a side structure of a display module according to an embodiment of this application.

This application provides a display apparatus. A display module of the display apparatus is shown in FIG. 3 to FIG. 5. FIG. 3 is a schematic diagram of a top-view structure of the display module, FIG. 4 is a schematic diagram of a top-view structure that exists after the display module is bent, and FIG. 5 is a schematic diagram of a side structure of the display module. The display module includes a display region 1 and a non-display region 2. The display region 2 is a polygonal display region 2, and the non-display region 2 is located around the display region 1. The non-display region 2 includes a plurality of non-display portions 21. The non-display portions 21 are in a one-to-one correspondence with side edges of the display region 1. The display module may be an active matrix organic light emitting display (Active Matrix Organic Light Emitting Display, AMOLED for short). The display region 1 occupies a majority of an area of the display module, is used to display a picture, and mainly includes a pixel circuit and an organic light emitting diode array, to provide device support for displaying a picture. The non-display region 2 around the display region 1 is mainly used to accommodate a drive device and a reliability structure and to design a cable of the display module, to provide a drive signal and reliability protection for the display region 1. A gate driver on array (Gate Driver on Array, GOA for short) circuit 3 may be designed in non-display portions 21 on the left and right sides of the display module, to implement scanning line by line. A signal cable 4 may be designed and a peripheral drive device may be mounted in a non-display portion 21 at a bottom of the display module. The peripheral drive device may be a drive chip 5 (IC), a flexible printed circuit 6 (Flexible Printed Circuit, FPC for short), and the like. The region is an outer lead bonding (Outer Lead Bonding, OLB for short) region, and is used to implement scanning column by column, to implement a display function of the display module. At least two of the plurality of non-display portions 21 of the display module are bent to a back side of the display region 1. A relatively large quantity of non-display portions 21 are bent to the back side of the display region 1, and therefore a screen-to-body ratio of the display module can be increased. In addition, the non-display portions 21 are bent to the display region 1, and therefore there is no need to consider a problem of reducing a frame, and a relatively large width can be designed for the non-display portions 21 bent to the back side of the display region 1. In this way, it can be implemented that design space of the non-display portions 21 is not limited, and a width of a signal line, a size of a reliability device, and a water oxygen protection path can be designed with reliability, thereby improving reliability of a display.

Figure 6:
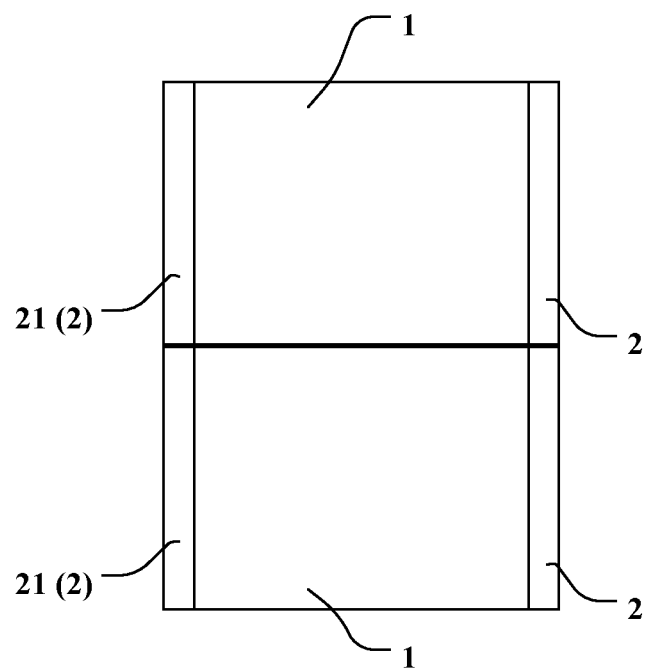
FIG. 6 is a schematic diagram of a structure in which display modules are spliced for display according to an embodiment of this application.
Figure 7:
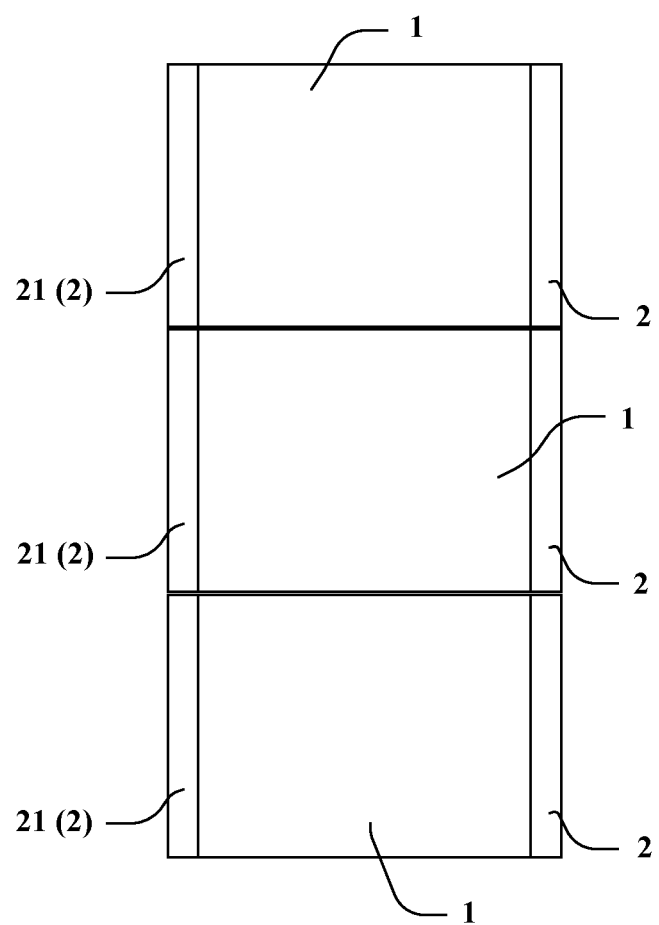
FIG. 7 is another schematic diagram of a structure in which display modules are spliced for display according to an embodiment of this application.

As shown in FIG. 3 and FIG. 4, for example, the display module is a rectangular display module. The display region 1 of the display module includes four side edges, and the display module includes four non-display portions 21. Two opposite non-display portions 21 are respectively a first non-display portion 211 and a second non-display portion 212. The first non-display portion 211 and the second non-display portion 212 are bent to the back side of the display region 1. In this solution, the screen-to-body ratio of the display module can be increased, and splicing of display modules is further facilitated, to implement splicing display. For example, two display modules, three display modules, or a plurality of display modules are spliced. FIG. 6 and FIG. 7 respectively show cases in which two display modules are spliced for display and three display modules are spliced for display. A smaller area of a region that is not displayed between adjacent display modules indicates a better splicing display effect.

Figure 8:
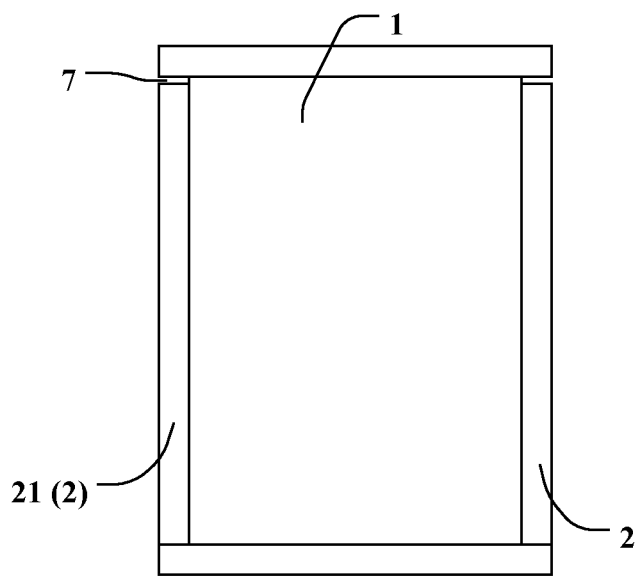
FIG. 8 is another schematic diagram of an expanded structure of a display module according to an embodiment of this application.
Figure 9:
FIG. 9 is a schematic diagram of a top-view structure of a display module according to an embodiment of this application.
Figure 10:
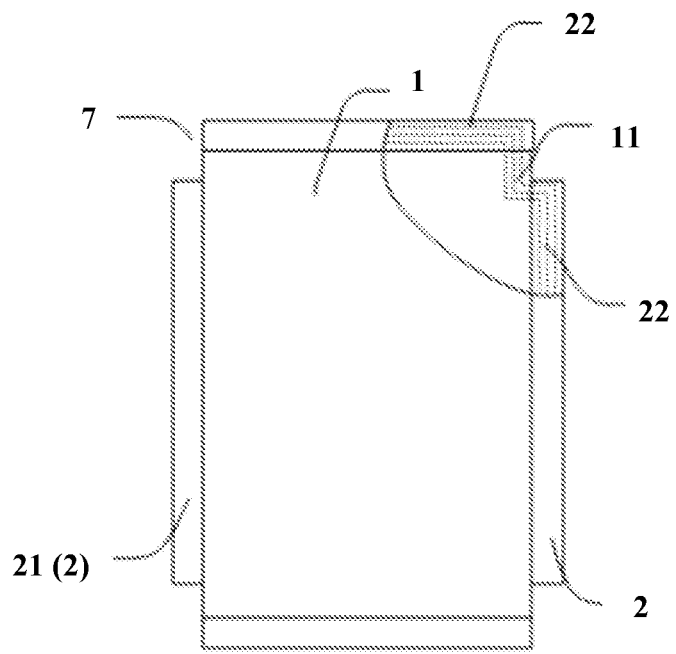
FIG. 10 is a schematic diagram of a partial cross-sectional structure of a display module according to an embodiment of this application.

FIG. 8 is a schematic diagram of an expanded structure of the display module, and FIG. 9 is a schematic diagram of a structure in which adjacent non-display portions 21 of the display module are bent to the back side of the display region 1. When the non-display portions 21 bent to the back side of the display region 1 include the adjacent non-display portions 21, to reduce pulling force between the adjacent non-display portions 21 and reduce stress concentration between the adjacent non-display portions 21, an opening 7 may be disposed between every two adjacent non-display portions 21 in the non-display portions 12 bent to the back side of the display region 1. That is, there is an unconnected part between the adjacent non-display portions 21, and the unconnected part is located in an edge region of the non-display region 2. Therefore, when the non-display portions 21 are bent to the back side of the display region 1, there is relatively small pulling force between the adjacent non-display portions 21, and stress concentration is not likely to occur, to help improve reliability of the display module. FIG. 10 is a schematic diagram of a partial cross-sectional structure of the display module according to an embodiment of this application. Usually, the non-display portion 21 is provided with a signal line 22, and signal lines 22 of the adjacent non-display portions need to be electrically connected. Specifically, a connecting line may be disposed between the signal lines 22 of the adjacent non-display portions, and the connecting line is located on the back side of the display region.

In a specific embodiment, a quantity of side edges of the display region 1 of the display module is not limited. The display region 1 may include four side edges, five side edges, six side edges, or the like. Any quantity is applicable to the technical solutions of this application. The non-display portions 21 bent to the back side of the display region 1 may be or may not be adjacent to each other. A specific quantity of non-display portions 21 bent to the back side of the display region 1 is also not limited. A larger quantity of non-display portions 21 bent to the back side of the display region 1 indicates a larger screen-to-body ratio of the display module.

Figure 11:
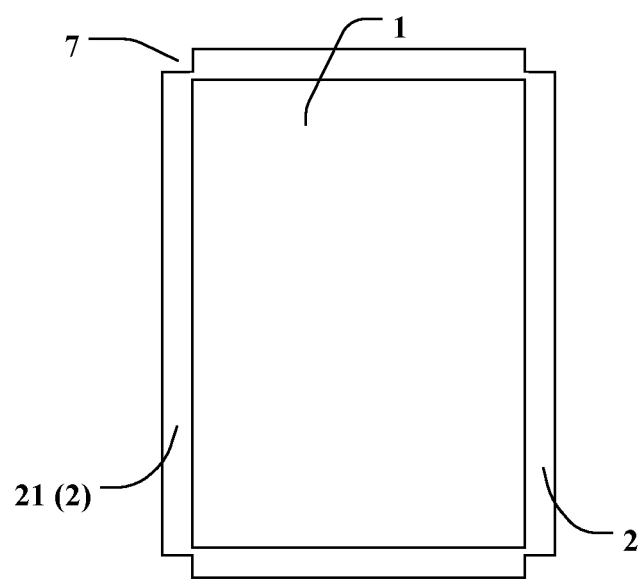
FIG. 11 is another schematic diagram of an expanded structure of a display module according to an embodiment of this application.
Figure 12:
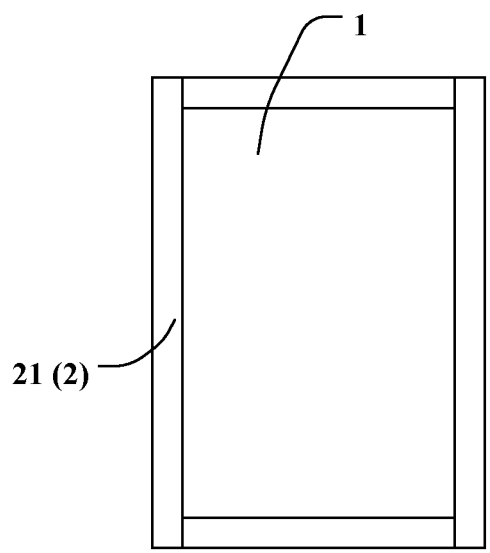
FIG. 12 is a schematic diagram of a back side structure of a display module according to an embodiment of this application.
Figure 13:
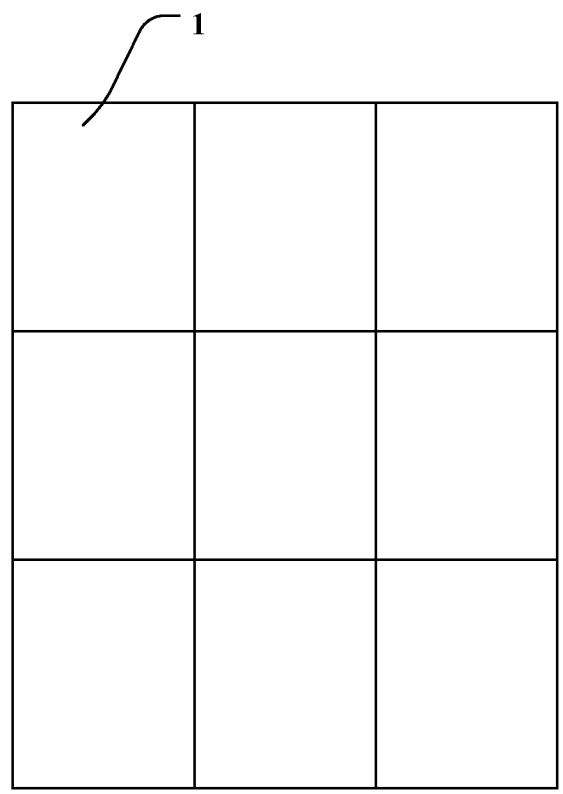
FIG. 13 is another schematic diagram of a structure in which display modules are spliced for display according to an embodiment of this application.

FIG. 11 is a schematic diagram of an expanded structure of the display module, and FIG. 12 is a schematic diagram of a back side structure in which all of the non-display portions 21 of the display module are bent to the back side of the display region 1. In this solution, all of the non-display portions 21 of the display module are bent to the back side of the display region 1, to implement a frameless structure of the display module. This helps maximize the screen-to-body ratio, and facilitates splicing of the display module from each side edge for display, and there is a relatively good splicing effect. FIG. 13 is a schematic diagram of a structure in which display modules are spliced. In this solution, all of the display modules are frameless display modules. Therefore, after splicing, a size of a region that is not displayed between adjacent display modules is relatively small, and a splicing manner may be selected based on a requirement.

Figure 14:
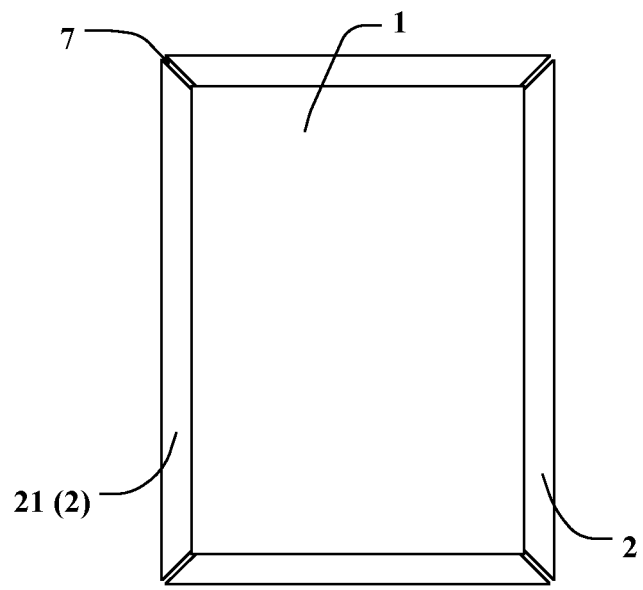
FIG. 14 is another schematic diagram of an expanded structure of a display module according to an embodiment of this application.

During specific disposing of the opening 7, the opening 7 extends from an edge that is of the non-display region 2 and that is far away from the display region 1 to the display region 1. The opening 7 may not extend to an edge of the display region 1, as shown in FIG. 11. Alternatively, the opening 7 may extend to an edge of the display region 1. Refer to FIG. 14. The adjacent non-display portions 21 are completely disconnected, and there is no connected part. Therefore, when the adjacent non-display portions 21 are bent to the back side of the display region 1, there is no pulling force between the adjacent non-display portions 21. The non-display portions 21 are connected to the side edges of the display region 1, and therefore the opening 7 between the adjacent non-display portions 21 is opposite to a corner region of the display region 1. Therefore, in the embodiments of this application, there is no stress concentration in a corner region of the display module. This helps improve reliability of the display module while the frameless structure of the display module is implemented.

Figure 15:
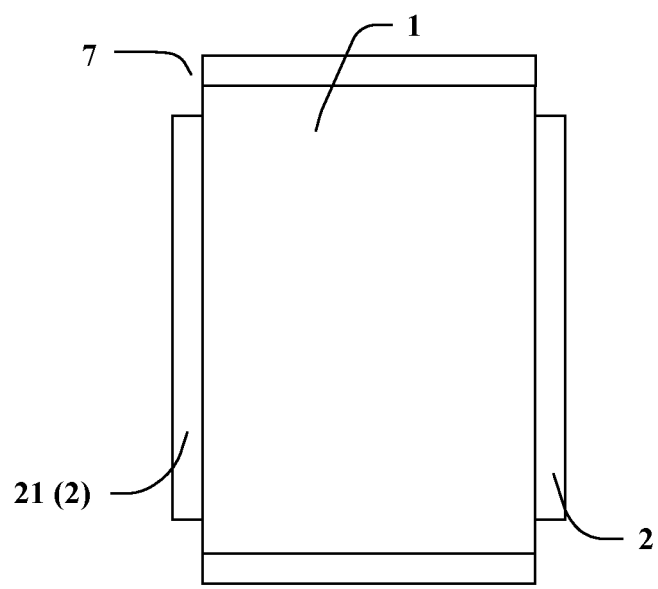
FIG. 15 is another schematic diagram of an expanded structure of a display module according to an embodiment of this application.

During specific disposing of the opening 7, a specific form of the opening 7 is not limited. A gap may be disposed between the adjacent non-display portions 21, or a groove may be disposed between the adjacent non-display portions 21. FIG. 14 is a schematic diagram of an expanded structure of the display module, and is a schematic diagram of a structure in which a gap is disposed between the adjacent non-display portions 21. In this solution, the non-display region 2 has a relatively large area, so that more space is available for cabling and design of another structure. In addition, in this solution, there is a relatively simple manufacturing process. When the opening 7 is a gap, a specific extension direction of the gap is not limited, provided that the adjacent non-display portions 21 are disconnected in the corner region. FIG. 15 is a schematic diagram of an expanded structure of the display module, and is a schematic diagram of a structure in which a groove is disposed between the adjacent non-display portions 21. In this solution, an area of an overlapping region that exists after the adjacent non-display portions 21 are bent to the back side of the display region 1 may be reduced, and reliability of a permanent connection that exists after the non-display portions 21 are bent may be improved, to help further improve reliability of the display module.

When the opening 7 is a groove, a specific shape of the groove is not limited. The groove may be a U-shaped groove, a V-shaped groove, or a rectangular groove, or may be a groove in another shape. This is not limited in this application. A user may make a selection based on a requirement such as line layout or a simplified manufacturing process.

Figure 16:
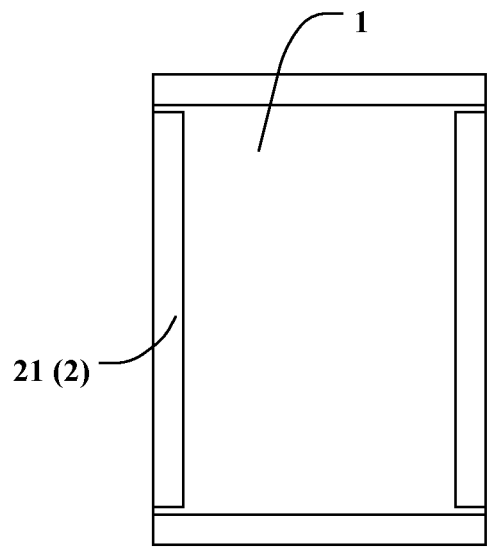
FIG. 16 is a schematic diagram of a back side structure of a display module according to an embodiment of this application.
Figure 17:
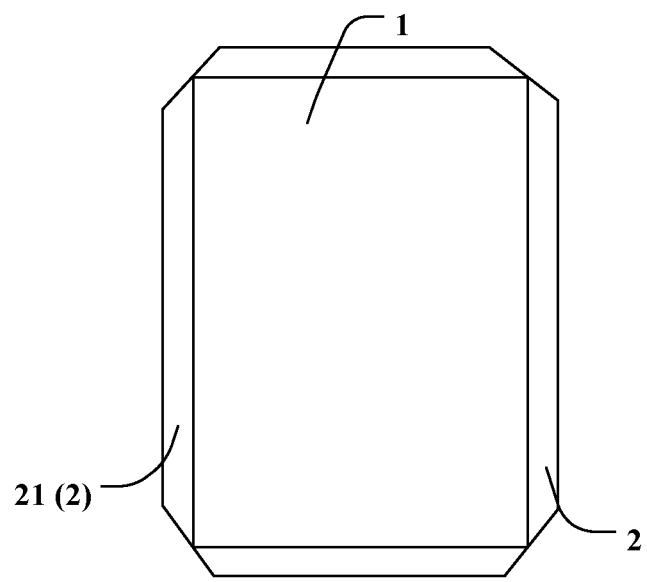
FIG. 17 is another schematic diagram of an expanded structure of a display module according to an embodiment of this application.
Figure 18:
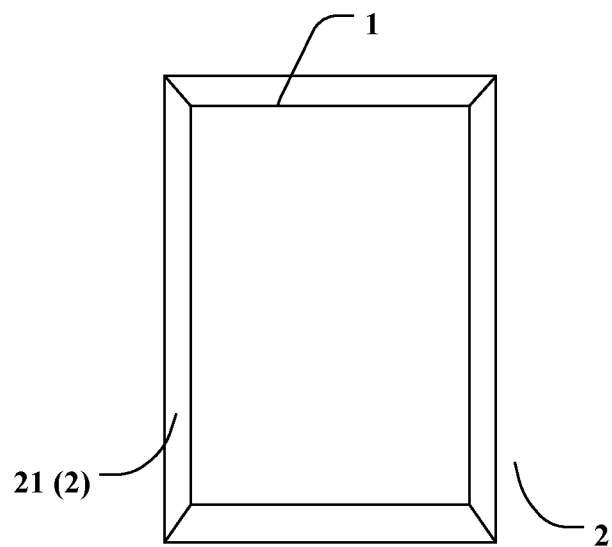
FIG. 18 is a schematic diagram of a back side structure of a display module according to an embodiment of this application.

Refer to FIG. 15 and FIG. 16. FIG. 16 is a schematic diagram of a back side structure in which only one layer of non-display portions 21 is fastened to the back side of the display region 1 of the display module. In this solution, the shape of the opening 7 may be properly designed, so that the adjacent non-display portions 21 give way to each other after being bent to the back side of the display region 1. Only one layer of non-display portions 21 and the display region 1 may be stacked, or at least two layers of non-display portions 21 and the display region 1 may be stacked. For the display module, when only one layer of non-display portions 21 and the display region 1 are stacked, in other words, the non-display portions 21 bent to the back side of the display region 1 do not overlap, interference between the bent non-display portions 21 can be reduced, thereby improving reliability of the display module. FIG. 17 is a schematic diagram of an expanded structure of the display module, and FIG. 18 is a schematic diagram of a back side structure in which only one layer of non-display portions 21 is fastened to the back side of the display region 1 of the display module.

Figure 19:
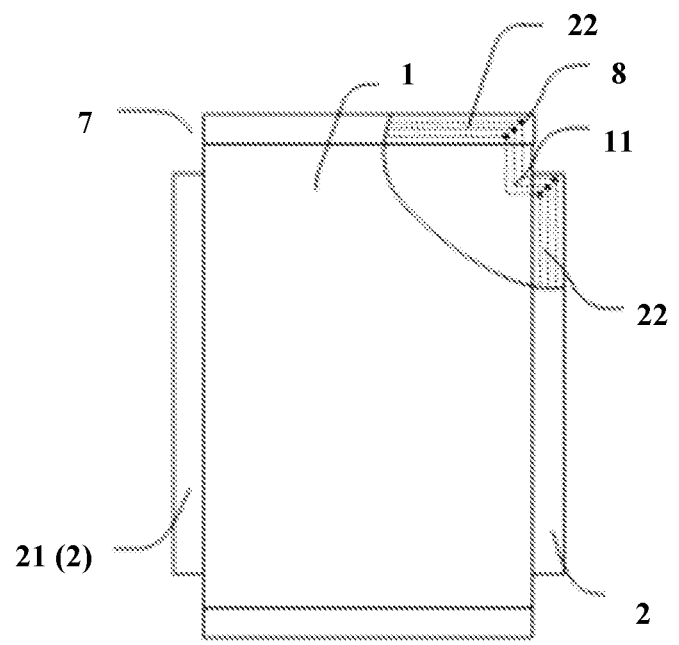
FIG. 19 is another schematic diagram of a partial cross-sectional structure of a display module according to an embodiment of this application.

FIG. 19 is a schematic diagram of a partial cross-sectional structure of the display module according to an embodiment of this application. In the embodiments of this application, when the signal line 22 and the connecting line 11 are specifically made, the signal line 22 may be made in the non-display region 2, then the connecting line 11 may be made on a back side of the corner region of the display region 1, and then the signal line 22 and the connecting line 11 are electrically connected, to implement an electrical connection between the adjacent non-display portions 21. In the embodiments of this application, although the opening 7 is disposed between the adjacent non-display portions 21, a cabling design for connection may still be implemented between the adjacent non-display portions 21.

Refer to FIG. 19. During specific implementation of a connection between the signal line 22 and the connecting line 11, the signal line 22 and the connecting line 11 may be disposed at a same layer and electrically connected. Refer to FIG. 17. In another embodiment, the signal line 22 and the connecting line 11 may be disposed at different layers, and are electrically connected by disposing a via hole 8 between the signal line 22 and the connecting line 11, to implement cabling design of the display module.

Figure 20:
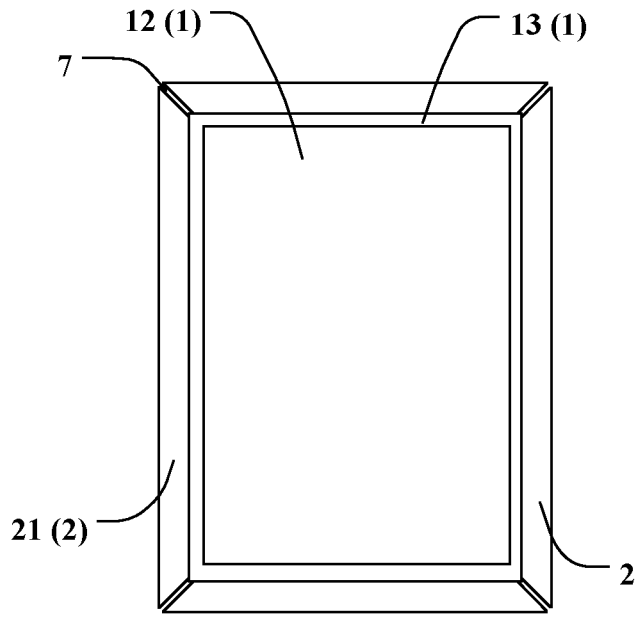
FIG. 20 is another schematic diagram of an expanded structure of a display module according to an embodiment of this application.

FIG. 20 is a schematic diagram of an expanded structure of the display module. In the embodiments of this application, the display region 1 includes an active display region 12 and a dummy pixel region 13 (Dummy pixel region). The dummy pixel region is located between the active display region 12 and the non-display portion 21. The dummy pixel region 13 is used as a buffer between the active display region 12 and the non-display region 2, and is displayed in a dark state, to avoid abnormal display during transition from the display region 1 to the non-display region 2.

During disposing of the connecting line 11, the connecting line 11 may be disposed in the dummy pixel region 13. In this way, there is no need to dispose the connecting line 11 in the active display region 12, to help improve a display effect of the active display region 12.

Certainly, the dummy pixel region 13 may not be bent to the back side of the display region 1, or may be bent to the back side of the display region 1. Alternatively, the display module is bent in the dummy pixel region 13, that is, the non-display portions 21 are bent along the dummy pixel region 13, that is, after the non-display portions 21 are bent, the dummy pixel region 13 is located on a side surface. Therefore, it can be ensured that the active display region 12 in the display region 1 is not affected by a bent structure, and the non-display portion 21 can be completely bent to the back side of the display region 1.

Figure 21:
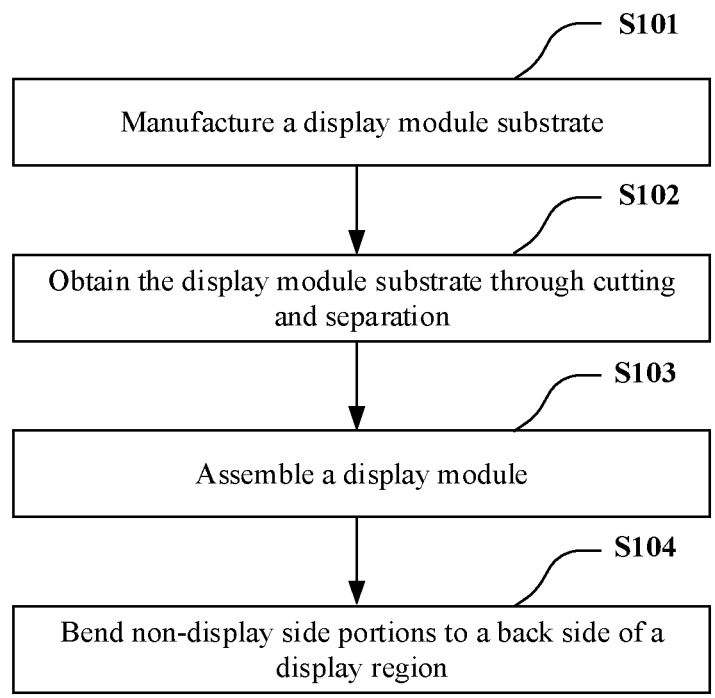
FIG. 21 is a schematic diagram of steps of manufacturing a display module according to an embodiment of this application.

This application further provides a method for manufacturing an AMOLED display module. Refer to FIG. 21. The method specifically includes the following steps.

Figure 22:
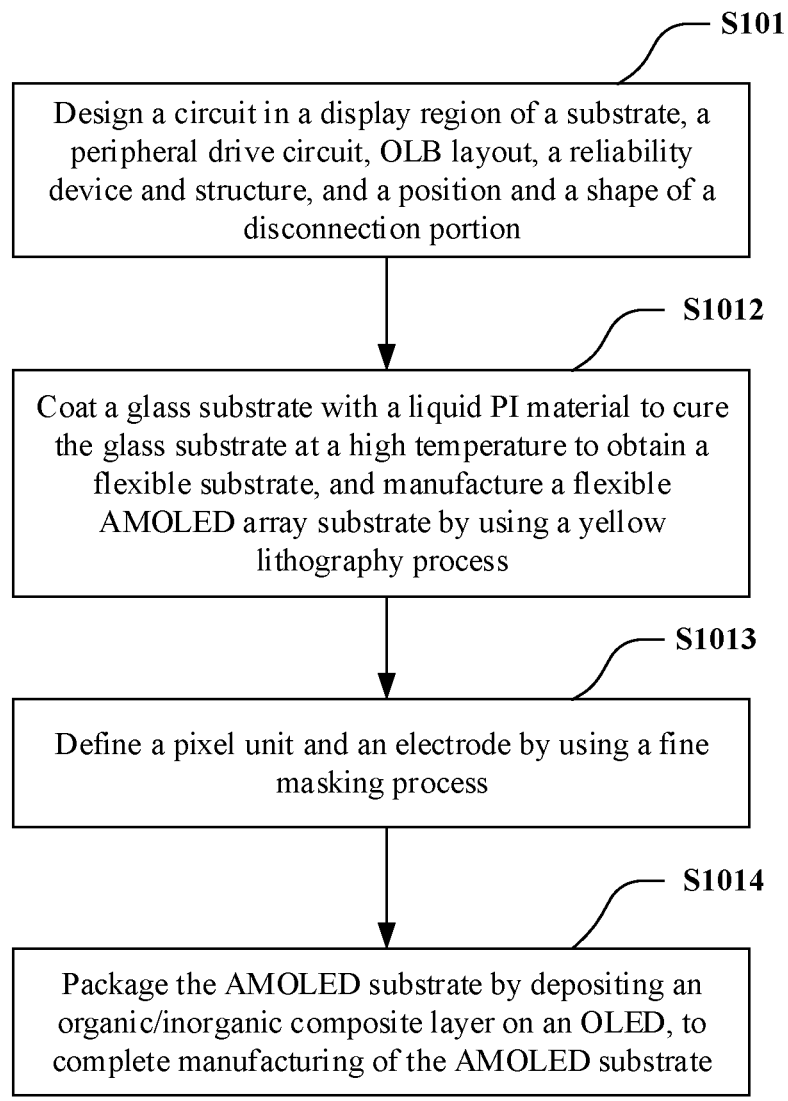
FIG. 22 is a schematic diagram of steps of manufacturing a display module according to an embodiment of this application.

Step S101: Manufacture a display module substrate. Specifically, this step includes step S1011 to step S1014. Refer to FIG. 22.

Step S1011: Design a circuit in a display region of the substrate, a peripheral drive circuit, OLB layout, a reliability device and structure, and a position and a shape of an opening. Step S1012: Coat a glass substrate with a liquid PI material to cure the glass substrate at a high temperature to obtain a flexible substrate, and manufacture a flexible AMOLED array substrate by using a yellow lithography process. Step S1013: Define a pixel unit and an electrode by using a fine masking process. Step S1014: Package the AMOLED substrate by depositing an organic/inorganic composite layer on an OLED, to complete manufacturing of the AMOLED substrate.

Step S102: Obtain the display module substrate through cutting and separation.

The display module substrate and the opening in a non-display region are obtained by cutting the substrate by using a laser or a knife flywheel, and the display module substrate is separated from the glass substrate by heating thermal release adhesive on the glass substrate by using the laser.

Step S103: Assemble the display module.

Film layers such as a polarizer and a touchscreen are fitted on a side of a light emitting surface of the display module substrate, connecting pins of an IC and an FPC are bonded to terminals of the substrate in a pin-to-pin manner through OLB engineering, and then a reinforced backplane and a surface cover are assembled.

Step S104: Bend non-display portions to a back side of the display region.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A display, comprising:
a polygonal display region comprising side edges and a first back side;
non-display portions in a one-to-one correspondence with the side edges, wherein at least two of the non-display portions are bent to the first back side, and wherein when the at least two non-display portions that are bent to the first back side of the polygonal display region include adjacent non-display portions, an opening formed between every two of the adjacent non-display portions; and
a connecting line formed between signal lines of the adjacent non-display portions on the first back side of the polygonal display region,
wherein the polygonal display region further comprises:
an active display region; and a dummy pixel region located between the active display region and the non-display portions, and
wherein the non-display portions are bent to the first back side of the polygonal display region along the dummy pixel region.

2. The display of claim 1, wherein the connecting line is disposed on a second back side of the dummy pixel region.

3. The display of claim 1, wherein the signal lines and the connecting line are at different layers, and wherein each of the signal lines is coupled to the connecting line through a via hole.

4. The display of claim 1, wherein the non-display portions are bent to the first back side.

5. The display of claim 1, wherein the opening comprises a gap.

6. The display module of claim 1, wherein the non-display portions bent to the first back side do not overlap.

7. The display of claim 1, wherein the opening comprises a groove.

8. The display of claim 7, wherein the groove is a U-shaped groove, a V-shaped groove, or a rectangular groove.

9. A display apparatus, comprising:
a display comprising:
a polygonal display region comprising side edges and a first back side;
non-display portions in a one-to-one correspondence with the side edges, wherein at least two of the non-display portions are bent to the first back side, and wherein when the at least two non-display portions that are bent to the first back side of the polygonal display region include adjacent non-display portions, an opening formed between every two of the adjacent non-display portions; and
a connecting line formed between signal lines of the adjacent non-display portions on the first back side of the polygonal display region,
wherein the polygonal display region further comprises:
an active display region; and
a dummy pixel region located between the active display region and the non-display portions, and
wherein the non-display portions are bent to the first back side of the polygonal display region along the dummy pixel region.

10. The display apparatus of claim 9, wherein the connecting line is disposed on a second back side of the dummy pixel region.

11. The display apparatus of claim 9, wherein the signal lines and the connecting line are at different layers, and wherein each of the signal lines is coupled to the connecting line through a via hole.

12. The display apparatus of claim 9, wherein the non-display portions are bent to the first back side.

13. The display apparatus of claim 9, wherein the opening comprises a gap.

14. The display apparatus of claim 9, wherein the opening comprises a groove.

15. The display apparatus of claim 14, wherein the groove is a U-shaped groove, a V-shaped groove, or a rectangular groove.

16. The display apparatus of claim 9, wherein the non-display portions bent to the first back side do not overlap.

* * * * *